United States Patent
Bae

(10) Patent No.: US 9,719,189 B2
(45) Date of Patent: Aug. 1, 2017

(54) PROCESS OF SURFACE TREATMENT FOR WAFER

(75) Inventor: Heung Teak Bae, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 522 days.

(21) Appl. No.: 14/240,692

(22) PCT Filed: Aug. 21, 2012

(86) PCT No.: PCT/KR2012/006631
§ 371 (c)(1),
(2), (4) Date: May 2, 2014

(87) PCT Pub. No.: WO2013/027995
PCT Pub. Date: Feb. 28, 2013

(65) Prior Publication Data
US 2014/0290566 A1    Oct. 2, 2014

(30) Foreign Application Priority Data
Aug. 22, 2011 (KR) .................. 10-2011-0083296

(51) Int. Cl.
*C30B 25/02* (2006.01)
*C30B 23/02* (2006.01)
*H01L 21/3065* (2006.01)
*H01L 21/02* (2006.01)
*H01L 29/16* (2006.01)

(52) U.S. Cl.
CPC ...... *C30B 23/025* (2013.01); *H01L 21/02658* (2013.01); *H01L 21/3065* (2013.01); *H01L 29/1608* (2013.01)

(58) Field of Classification Search
CPC ............................. C30B 25/02; C30B 25/183
See application file for complete search history.

(56) References Cited

U.S. PATENT DOCUMENTS

| | | | |
|---|---|---|---|
| 4,902,645 A | | 2/1990 | Ohba |
| 5,571,571 A | * | 11/1996 | Musaka ................ C23C 16/402 |
| | | | 257/E21.278 |
| 5,705,433 A | * | 1/1998 | Olson ............... H01L 21/32137 |
| | | | 257/E21.312 |
| 2008/0050844 A1 | | 2/2008 | Masuda |
| 2008/0142886 A1 | * | 6/2008 | Liao .................. H01L 21/02057 |
| | | | 257/347 |
| 2008/0245767 A1 | | 10/2008 | Kim et al. |

FOREIGN PATENT DOCUMENTS

KR    10-0711521 B1    4/2007

OTHER PUBLICATIONS

International Search Report dated Feb. 15, 2013 in International Application No. PCT/KR2012/006631, filed Aug. 21, 2012.
International Search Report in International Application No. PCT/KR2012/006631, filed Feb. 15, 2013.

* cited by examiner

*Primary Examiner* — Robert M Kunemund
(74) *Attorney, Agent, or Firm* — Saliwanchik, Lloyd & Eisenschenk

(57) ABSTRACT

Disclosed is a process of surface treatment of a substrate. The method of treating a surface of a substrate comprises preparing the substrate, and performing an etching process with respect to a surface of the substrate. The etching process comprises a step of introducing etching gas to the surface of the substrate, and the etching gas comprises a halogen compound and a silane compound.

11 Claims, 1 Drawing Sheet

PROCESS OF SURFACE TREATMENT FOR WAFER

CROSS-REFERENCE TO RELATED APPLICATIONS

This application is the U.S. national stage application of International Patent Application No. PCT/KR2012/006631, filed Aug. 21, 2012, which claims priority to Korean Application No. 10-2011-0083296, filed Aug. 22, 2011, the disclosures of each of which are incorporated herein by reference in their entirety.

TECHNICAL FIELD

The disclosure relates to a process of the surface treatment for a wafer and a method of fabricating an epitaxial wafer.

BACKGROUND ART

Various types of defects exist on surfaces of a silicon-carbide wafer and an epitaxial wafer. Such defects increase a surface roughness of the silicon-carbide wafer, causing a bad influence upon the subsequent processes. A surface defect on the silicon-carbide wafer results in another defect in growing a single crystal layer and causes a rough surface. The surface defect on the epitaxial wafer may cause a partial isolation in laminating several layers. Further, when a device is fabricated using such a wafer, a leakage current may be increased by non-uniformity of metal electrode deposition and patterns.

For this reason, the life span of a device may be reduced and reliability of the device may be lowered. Thus, it is very important in manufacturing a high quality device to remove and control such a defect.

According to the related art, in order to control the surface defect of the silicon carbide wafer, halogen gas treatment is performed or hydrocarbon gas and hydrogen gas are applied so that the defects are controlled. An etching step may be generally performed through a wet etching scheme or a dry etching scheme.

For example, according to in-situ hydrogen etching, hydrogen is adsorbed on the surface of the silicon carbide wafer to reduce the surface energy, so that Si and C adsorbed on the surface of the silicon carbide wafer are smoothly moved. However, if the hydrogen acts as the etching cause of C, the stoichiometrical relationship on the surface of the wafer is broken, thereby causing the defects to the surface of the wafer.

In addition, the etching scheme based on hydrochloric acid (HCl) is used in the Si-face epitaxial growing, and prevents silicon (Si) from being aggregated on the surface of the wafer to reduce Si droplets and the surface defects of the wafer. However, if the etching for silicon (Si) is excessively performed, the etch-pit may be created to cause defects.

In addition, if the treatment of $CH_x$ is performed, carbon-bonds are induced on the Si-face surface to help grow the epitaxial layer representing less defects as compared with silicon (Si) representing a higher aggregation characteristic. However, if the treatment of CHx is excessively performed, a C—C bond may be crated to cause a problem in the bonding between the epitaxial layer and the silicon carbide wafer.

Therefore, a wafer and an epitaxial wafer having an epitaxial layer grown on the wafer, which represent a lower defect density by removing defect causes resulting from the excessive etching during the etching process, are required.

In particular, as shown in FIG. 1, when the wafer is etched by using HCl, silicon (Si) are excessively extracted due to the excessive etching of HCl, so that another surface defects may be caused after the etching process has been performed.

Therefore, in order to remove the surface defects resulting from the etching, a scheme of complementing silicon (Si) according to the excessive extraction of the silicon (Si) is required.

DISCLOSURE OF INVENTION

Technical Problem

The embodiment is to fabricate a silicon carbide epitaxial wafer having a low defect density by using the surface treatment of the wafer.

Solution to Problem

According to the embodiment, there is provided a process of the surface treatment for a substrate comprising preparing the substrate, and performing an etching process with respect to a surface of the substrate. The etching process comprises a step of applying etching gas to the surface of the substrate, and the etching gas comprises a halogen compound and a silane compound.

Advantageous Effects of Invention

The process of the surface treatment for a wafer comprises a step of introducing etching gas to the wafer, and the etching gas may comprise a halogen compound and a silane compound. In this case, the halogen compound may comprise HCl, and the silane compound may comprise SiHx, methylchlorosilane (MTS), or tetratrichlorosilane (TCS).

Therefore, the silane compound complements silicon (Si) extracted through the HCl etching scheme, thereby removing the defects of a silicon carbide (SiC) wafer caused by the HCl etching scheme.

Therefore, the quality of the wafer can be increased. In particular, a high-quality epitaxial layer can be grown with a low defect density when the epitaxial layer is grown on the wafer.

In addition, the performance of a device employing the epitaxial wafer is improved, so that the superior electrical characteristic can be represented.

MODE FOR THE INVENTION

Figure 1:
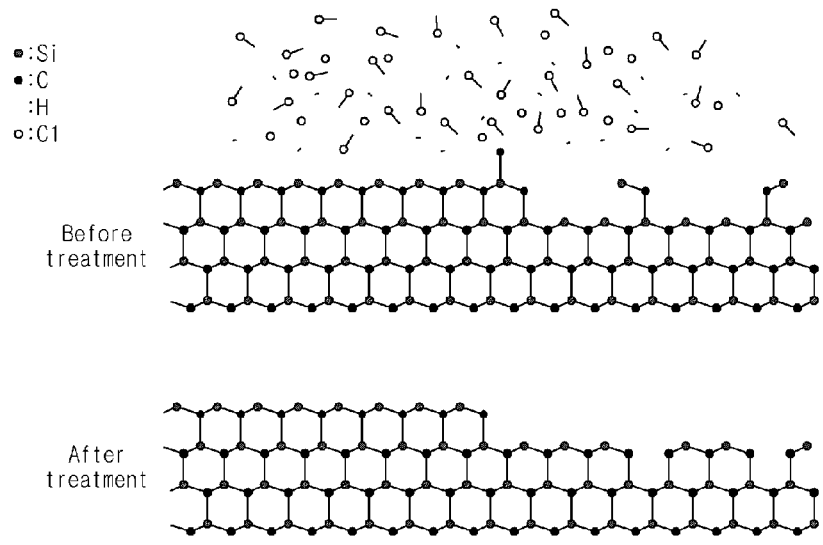
FIG. 1 is a view showing molecular bonding representing surface defects created due to the excessive extraction of Si according to an HCl etching scheme according to the related art.

In the description of the embodiments, it will be understood that, when a layer (or film), a region, a pattern, or a structure is referred to as being "on" or "under" another substrate, another layer (or film), another region, another pad, or another pattern, it can be "directly" or "indirectly" on the other substrate, layer (or film), region, pad, or pattern, or one or more intervening layers may also be present. Such a position of the layer has been described with reference to the drawings.

The thickness and size of each a layer (or film), each region, each pattern, or each structure shown in the drawings may be exaggerated, omitted or schematically drawn for the purpose of convenience or clarity. In addition, the size of the layer (or film), the region, the pattern, or the structure does not utterly reflect an actual size.

Hereinafter, the embodiment of the disclosure will be described in detail with reference to accompanying drawings.

Figure 2:
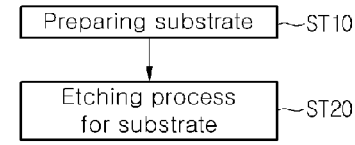
FIG. 2 is a flowchart showing the process of the surface treatment for a substrate according to the embodiment.

FIG. 2 is a flowchart showing the process of the surface treatment for a wafer according to the embodiment.

Referring to FIG. 2, the process of the surface treatment for a wafer according to the embodiment comprises a step of preparing a substrate (step ST10) and a step of performing an etching process with respect to the surface of the substrate (step ST20). The etching process comprises a step of introducing the etching gas to the surface of the substrate. The etching gas comprises a halogen compound and a silane compound.

According to the step of preparing the substrate (step ST10), a wafer may be prepared. The wafer may comprise a silicon carbide wafer. In addition, the wafer may comprise a silicon carbide wafer before an epitaxial layer is grown.

The wafer may have defects on the surface thereof. The defects may protrude from the surface of the wafer. The defects increase the surface roughness of the wafer to significantly exert a bad influence to the following processes. The surface defects on the wafer may cause another defect when the epitaxial layer is grown, so that the epitaxial layer has a rough surface.

According to the etching process (step ST20), the etching gas may be introduced to the surface of the wafer. In other words, in order to remove the surface defect of the wafer, an oxide layer is formed on the wafer, and a dry etching process or a wet etching process is performed with respect to the wafer, so that the defects can be removed from the wafer surface.

The etching gas may comprise both of a halogen compound and a silane compound. The halogen compound may comprise hydrogen chloride (HCl) gas. The silane compound may comprise $SiH_x$, methylchlorosilane (MTS), or tetratrichlorosilane (TCS). In $SiH_x$, x represents the range of 1 to 4. In other words, the SiHx may comprise silane-based compounds in an instable state to a stable state.

Regarding the introduction ratio of a silane compound to a halogen compound, wherein the silane compound is introduced at a mole ratio in a range of 0.01 to 1 based on the halogen compound. The introduction ratio of the silane compound may be varied according to the extraction degree of Si extracted through the etching process of the halogen compound, that is, HCl.

In addition, the reaction temperature at which the introduced etching gas reacts to the surface of the wafer may be in the range of 1100° C. to 1650° C. Preferably, the reaction temperature may be in the range of 1175° C. or 1650° C.

Figure 3:
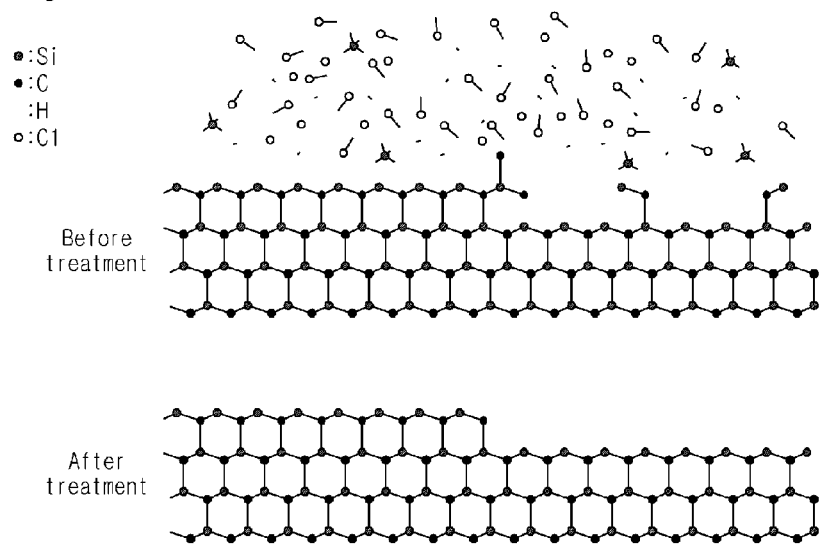
FIG. 3 is a view showing molecular bonding representing the removal of the surface defect resulting from the complementation of Si according to the process of the surface treatment for the substrate according to the embodiment.

FIG. 3 is a view showing that the halogen compound and the silane compound, which have been introduced to the surface of the wafer, react to the surface of the wafer.

Referring to FIG. 3, the halogen compound and the silane compound are introduced to the surface of the wafer to extract and complement silicon (Si) on the wafer. In other words, silicon (Si) protruding from the surface of the wafer may be etched. In addition, SiHx may complement silicon (Si) that have been excessively etched by HCl.

According to the related art, as shown in FIG. 1, the HCl etching is excessively performed, so that silicon (Si) are excessively extracted. Accordingly, etch-pit may be created in the wafer to cause another defects.

However, in the process of the surface treatment for the wafer according to the embodiment, a silane compound is introduced together with HCl so that silicon (Si) can be complemented. Accordingly, defects having higher energy can be removed from the wafer, so that the wafer can have low defects having stable low energy.

The epitaxial layer grown from the wafer having low defects may have a lower defect density, and the device employing the epitaxial wafer can represent higher electrical characteristics.

Figure 4:
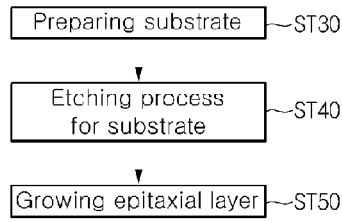
FIG. 4 is a flowchart showing a method of fabricating an epitaxial wafer according to the embodiment.

FIG. 4 is a flowchart showing a method of fabricating an epitaxial wafer according to the embodiment.

Referring to FIG. 4, the method of fabricating the epitaxial layer according to the embodiment comprises a step of preparing a substrate (step ST30), a step of performing an etching process with respect to the surface of the substrate (step ST40), and a step of growing an epitaxial layer on the substrate (step ST50). The etching process comprises a step of introducing the etching gas to the surface of the substrate. The etching gas comprises a halogen compound and a silane compound.

As described above, the etching gas may comprise both of a halogen compound and a silane compound. The halogen compound may comprise hydrogen chloride (HCl) gas. The silane compound may comprise SiHx, methylchlorosilane (MTS), or tetratrichlorosilane (TCS). In $SiH_x$, x represents the range of 1 to 4. In other words, the $SiH_x$ may comprise silane-based compounds in an instable state to a stable state.

Regarding the introduction ratio of a silane compound to a halogen compound, wherein the silane compound is introduced at a mole ratio in a range of 0.01 to 1 based on the halogen compound. The introduction ratio of the silane compound may be varied according to the extraction degree of Si extracted through the etching process of the halogen compound, that is, HCl.

Accordingly, the halogen compound and the silane compound are introduced to the surface of the wafer to extract and complement silicon (Si) on the wafer. Therefore, according to the epitaxial wafer fabricated according to the fabrication method, the epitaxial layer can be grown from the wafer having a flat surface without the surface defects through the etching process. Therefore, when the device employing the epitaxial wafer is used, superior electrical characteristics can be represented.

Any reference in this specification to "one embodiment," "an embodiment," "example embodiment," etc., means that a particular feature, structure, or characteristic described in connection with the embodiment is comprised in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A process of surface treatment for a substrate, the method comprising:
   preparing the substrate; and
   etching a surface of the substrate,
   wherein etching the surface of the substrate comprises:
   forming an oxide layer on the substrate;
   introducing etching as to the surface of the substrate; and
   performing a dry etching or a wet etching process with respect to the surface of the substrate,
   wherein the substrate comprises a silicon carbide substrate, and
   wherein the etching gas comprises a halogen compound and a silane compound.

2. The process of claim 1, wherein the halogen compound comprises hydrogen chloride (HCl).

3. The process of claim 1, wherein the silane compound comprises at least one selected from the group consisting of SiHx (x is an integer of 1 to 4), methylchlorosilane (MTS), and tetratrichlorosilane (TCS).

4. The process of claim 1, wherein the silane compound is introduced at a mole ratio in a range of 0.01 to 1 based on the halogen compound.

5. The process of claim 1, wherein the etching gas is introduced at a temperature of 1100° C. to 1650° C.

6. A method of fabricating an epitaxial wafer, the method comprising:
   preparing a substrate;
   etching a surface of the substrate; and
   growing an epitaxial layer from the substrate,
   wherein etching a surface of the substrate comprises:
   forming an oxide layer on the substrate;
   introducing etching gas to the surface of the substrate; and
   performing a dry etching or a wet etching process with respect to the surface of the substrate,
   wherein the substrate comprises a silicon carbide substrate, and
   wherein the etching gas comprises a halogen compound and a silane compound.

7. The method of claim 6, wherein the halogen compound comprises hydrogen chloride (HCl).

8. The method of claim 6, wherein the silane compound comprises at least one selected from the group consisting of SiHx (x is an integer of 1 to 4), methylchlorosilane (MTS), and tetratrichlorosilane (TCS).

9. The method of claim 6, wherein the silane compound is introduced at a mole ratio in a range of 0.01 to 1 based on the halogen compound.

10. The method of claim 6, wherein the etching gas is introduced at a temperature of 1100° C. to 1650° C.

11. The method of claim 6, wherein the epitaxial layer comprises silicon carbide (SiC).

* * * * *